United States Patent
Golke

[11] Patent Number: 5,867,039
[45] Date of Patent: *Feb. 2, 1999

[54] CMOS OUTPUT DRIVER WITH P-CHANNEL SUBSTRATE TRACKING FOR COLD SPARE CAPABILITY

[75] Inventor: Keith W. Golke, Minneapolis, Minn.

[73] Assignee: Honeywell Inc., Minneapolis, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 649,344

[22] Filed: May 17, 1996

[51] Int. Cl.⁶ .............................................. H03K 19/0185
[52] U.S. Cl. .................................. 326/81; 326/9; 326/86
[58] Field of Search ................................ 326/80–81, 83, 326/86, 23, 121, 68, 9; 361/91

[56] References Cited

U.S. PATENT DOCUMENTS

| | | | |
|---|---|---|---|
| 4,631,426 | 12/1986 | Nelson et al. | 326/80 |
| 5,004,936 | 4/1991 | Andresen | 326/27 |
| 5,117,129 | 5/1992 | Hoffman et al. | 326/83 |
| 5,151,619 | 9/1992 | Austin et al. | 326/86 |
| 5,406,140 | 4/1995 | Wert et al. | 326/81 |
| 5,570,043 | 10/1996 | Churchill | 326/81 |

*Primary Examiner*—Jon Santamauro
*Attorney, Agent, or Firm*—Gregory A. Bruns

[57] ABSTRACT

A CMOS output driver circuit with p-channel substrate tracking provides an output driver to full power supply voltage. The circuit is especially useful as a redundant circuit where its power supply connection is connected to ground and the circuit is kept in unbiased storage until it is needed.

17 Claims, 3 Drawing Sheets

5,867,039

CMOS OUTPUT DRIVER WITH P-CHANNEL SUBSTRATE TRACKING FOR COLD SPARE CAPABILITY

U.S. GOVERNMENT RIGHTS

The Government has rights in this invention pursuant to Contract No. F29602-89-C-0084, awarded by the Department of the Air Force.

BACKGROUND OF THE INVENTION

The present invention relates to fault tolerant systems and particularly to a CMOS driver circuit for use as a spare or redundant circuit.

In high reliability applications, e.g., spacecraft, cold spare is the condition where a spare or redundant parts power supply, $V_{DD}$, is connected to ground, $V_{SS}$, and kept in unbiased storage until the part is needed. The power savings from not using power while in the cold spare mode as compared to providing a warm or hot standby circuit is an important benefit of the cold spare circuit.

The cold spare circuit output remains connected to an active signal or data bus while in the cold spare mode and must therefore present a high impedance to the active signal.

A problem occurs where a typical CMOS output driver having a p-channel transistor drive to a high data state, i.e., $V_{DD}$ or $V_{CC}$ and an n-channel transistor drive to a low data state, i.e., $V_{SS}$.

FIG. 1 shows a typical CMOS output driver 1 including input 2, inverter 3, node A, inverter 4, node B, p-channel transistor P10, n-channel transistor N10, power supply connection $V_{DD}$, ground connection $V_{SS}$, and output 5.

FIG. 2 shows p-channel and n-channel MOS transistor schematic pin definitions as shown in the present patent application. The design of output driver 1 prevents using the part as a cold spare if the output node 5 to a package pin remains connected to an active signal or bus.

In FIG. 1, if $V_{DD}$ is connected to $V_{SS}$ but output node 5 remains connected to an active signal or bus as is the common situation, as an external output driver from another part on the signal or bus pin tries to drive the signal or bus, i.e., output node 5 high, the drain (D) to substrate (B) on junction of P10 will forward bias. Its substrate is connected to $V_{DD}$, which is connected to $V_{SS}$, resulting in a current path to $V_{SS}$. P10 is typically a very wide transistor resulting in a low impedance path to $V_{SS}$. The external driver will be unable to drive the signal or bus pin to a high state thereby preventing valid operation.

One proposed output driver in the past which does not use CMOS is shown in FIG. 6. The circuit of FIG. 6 only provides an output drive to $V_{DD}$ minus a bipolar junction transistor saturated VCE plus forward bias voltage drop. In addition, the circuit of FIG. 6 requires a diode type device and is implemented in BiCMOS technology.

Thus, a need exists for a CMOS driver circuit that provides a full CMOS output and can be used in a cold spare mode.

SUMMARY OF THE INVENTION

The present invention solves these and other problems by providing a CMOS driver circuit, including:

a power supply connection connected to a positive voltage when the driver circuit is active and connected to ground when the driver circuit is inactive;

a driver circuit input;

a first inverter having an input and an output;

a second inverter having an input and an output, said first inverter input and said second inverter input coupled to the driver circuit input;

a first p-channel transistor having a gate, a source, a drain, and a substrate, the gate coupled to the first inverter output; a first n-channel transistor having a gate, a source, a driver, and a substrate connected to the source, the gate coupled to the second inverter output, with the first p-channel transistor and the first n-channel transistor series connected between the power supply connection and ground;

a driver circuit output at the series connection, the driver circuit output connected to an external circuit when the driver circuit is active and when the driver circuit is inactive;

means for maintaining the first n-channel transistor in an off condition when the driver circuit is inactive; and means for causing the gate of the first p-channel transistor to track a voltage at the external circuit when the driver circuit is inactive, thereby maintaining the first p-channel transistor in an off condition.

DETAILED DESCRIPTION OF THE PRESENT INVENTION

Figure 3:
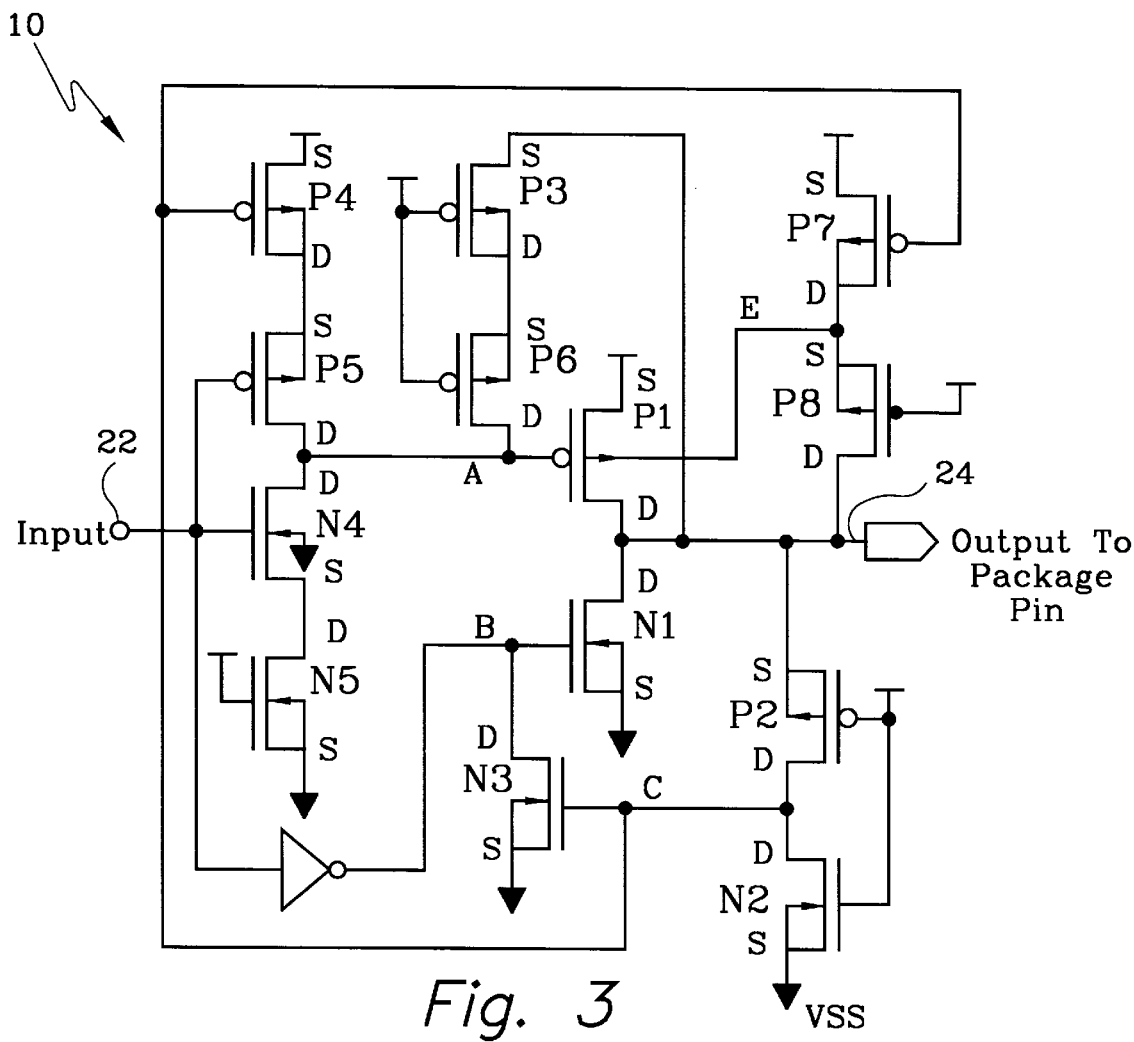
FIG. 3 is a schematic drawing of an output driver circuit according to the principles of the present invention.

A schematic of the preferred embodiment of the present invention is shown in FIG. 3 and generally designated 10. Output driver circuit 10 includes p-channel transistors P1, P2, P3, P4, P5, P6, P7 and P8, and n-channel transistors N1, N2, N3, N4 and N5. Circuit 10 further includes inverter 20, input 22 and output 24. In addition, circuit 10 includes nodes A, B, C, D and E. Power suppply connections shuch as $V_{DD}$ and ground such as $V_{SS}$ are shown by conventional symbols.

Output driver circuit 10 has two modes of operation. The first is called normal mode operation where $V_{DD}$ is connected to the power supply such that the part is active and the output driver must drive the signal or bus connected to the output node high or low depending on the input state. The second is called cold spare where $V_{DD}$ is connected to $V_{SS}$ but the output node remains connected to an active signal or bus which is driven high or low by another active part. Under this condition, the output node of the cold spare part must present a high impedance condition for any voltage level on the output node.

Normal Mode Operation ($V_{DD}$ is connected to the power supplies of driver circuit 10):

The gate of P2 is connected to $V_{DD}$ and therefore an inversion region will not form and the MOS conducting mechanism remains off. The source and substrate of P2 are connected to the output node 24 but since P2 is off and its drain (node C) is at $V_{SS}$, the substrate/drain pn junction remains reverse biased and output node 24 remains isolated from node C. The gate of N2 is connected to $V_{DD}$ and therefore N2 remains on. This forces node C to $V_{SS}$ which keeps N3 off. Therefore P2, N2 and N3 have no affect on output driver operation in normal mode. These transistors do affect P4 and P7 operation but, as will be explained below, P4 and P7 have no affect on output driver operation therefore the statement remains valid.

Figure 4:
FIG. 4 is a schematic of a portion of the circuit of FIG. 3.
Figure 4:

The gate of P3 and the gate of P6 are at $V_{DD}$ keeping these MOS transistors off. The substrates, P3 drain and P6 source are connected together. P3 and P6 are then equivalent to back to back diodes as shown in FIG. 4. For any combination of output node 24 and node A voltage there will be a reverse biased pn junction and output node 24 remains isolated from node A. Therefore P3 and P6 have no affect on output driver operation in normal mode.

The gate of N5 is connected to $V_{DD}$ and therefore remains on. The gate of P4 is connected to node C, which is held at $V_{SS}$, and therefore it will turn on if its source and substrate are high. The source of P4 is at $V_{DD}$ and the substrate is connected to the drain. The source/substrate pn junction is forward biased, resulting in the substrate being at $V_{DD}$ minus a diode forward bias voltage drop (Vfd). Vfd is approximately 0.7 volts. With the substrate at $V_{DD}$ minus Vfd, P4 will operate normally and therefore remains on driving node D and the substrate of P4 to $V_{DD}$. With P4 and N5 both continuously on, P5 and N4 function as an inverter.

The substrate of P1 is connected to P7 and P8. The gate of P7 is connected to node C which is held at $V_{SS}$ and its source/substrate pn junction is forward biased resulting in the substrate to be at $V_{DD}$-Vfd resulting in P7 being turned on and driving node E and the substrate of P7 to $V_{DD}$. The gate of P8 is at $V_{DD}$ and its source and substrate are connected to node E which is also at $V_{DD}$, therefore, P8 remains off and its drain/substrate pn junction remains reverse biased for any voltage between $V_{SS}$ and $V_{DD}$ on the output node therefore it has no affect on output driver operation in normal mode. With node E at $V_{DD}$, the substrate of P1 is at $V_{DD}$ and it will operate properly.

Figure 1:
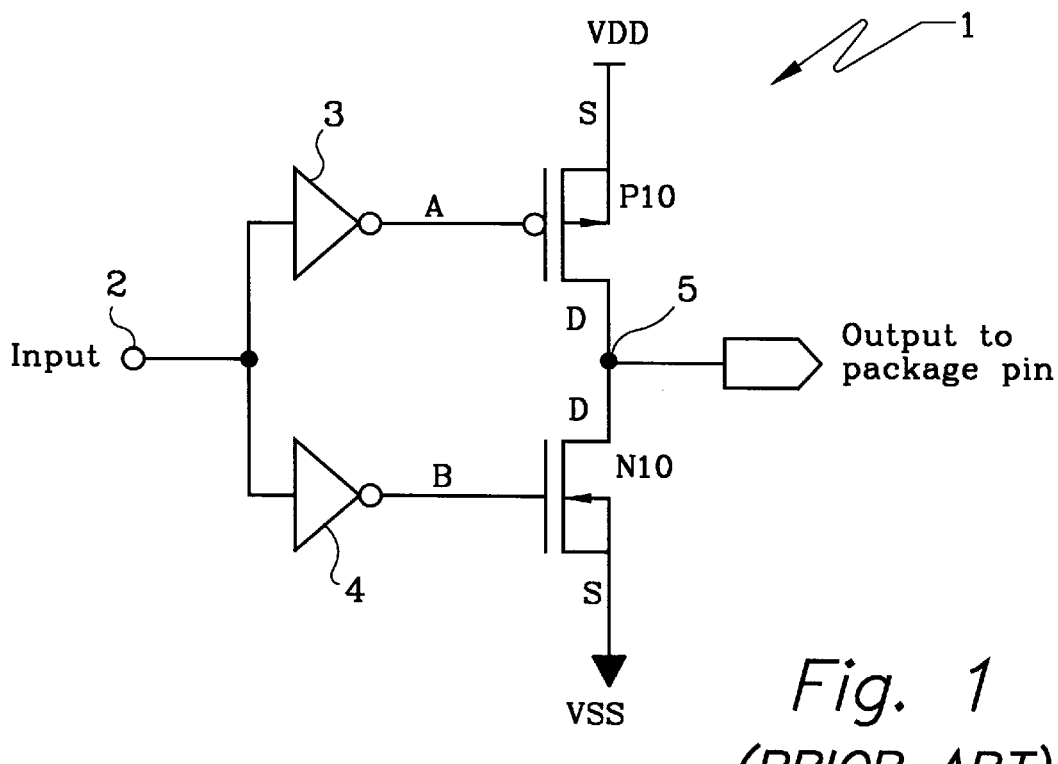
FIG. 1 is a schematic of a typical CMOS output driver according to the prior art.

Based on the above operation description, the circuit of FIG. 3 in normal mode is equivalent to the circuit of FIG. 1.

Cold Spare Mode Operation ($V_{DD}$ is connected to $V_{SS}$ of driver circuit 10):

When $V_{DD}$ is connected to $V_{SS}$, all circuitry becomes inactive. Internal nodes which were at $V_{DD}$ are immediately discharged through the p-channel transistor's drain/substrate pn junction to a Vfd voltage level. Over time, pn junction leakage currents will eventually discharge the node from Vfd to $V_{SS}$ but since this could take a long time relative to circuit operating cycle times, it is assumed that all internal nodes are at Vfd unless actively driven to another voltage.

In FIG. 3, N1 must remain off. To ensure this, the gate, source and substrate of N1 must remain at $V_{SS}$. Under these conditions N1 will remain off and the drain/substrate pn junction will remain reverse biased as the output node is driven between high and low. The source and substrate of N1 are directly connected to $V_{SS}$. The gate of N1 could be at Vfd which can be higher than the n-channel threshold voltage (Vtn) resulting in a situation where N1 may be weakly turned on resulting in a current path to $V_{SS}$ if the external signal or bus is being driven high. The Vfd voltage can be left over from $V_{DD}$ going from a high to $V_{SS}$ for power down or the voltage can be imposed from capacitive coupling between the drain of N1 (output node 24) and the gate of N1 (node B) which induces node B to exceed $V_{SS}$ when the output node goes high. The p-channel drain to substrate diode, however, would clamp the rise at Vfd. With $V_{DD}$ connected to $V_{SS}$, N2 remains off. With the source and substrate of P2 connected to the output node, P2 turns on if the output node voltage exceeds the p-channel threshold voltage (Vtp) and node C voltage will then track the output node voltage. With N2 off, there is no current path to $V_{SS}$. Thus, when the output node voltage goes high, node C also goes high turning N3 on. When N3 is turned on it actively drives the gate of N1 to $V_{SS}$, thereby ensuring that N1 stays off when the output node goes high.

P1 also must remain off. To ensure this, its gate voltage must track its drain voltage and the source must remain at $V_{SS}$. The source of P1 is directly connected to VSS (via $V_{DD}$ being connected to $V_{SS}$) and its substrate is connected to P7 and P8. P3 and P6 allow the node A voltage to track the output node voltage. The substrate of P3 is connected to the drain but the source/substrate pn junction is forward biased if the output node goes high resulting in the substrate to be at the output voltage (Vout) minus Vfd. With the substrate at Vout—Vfd and its gate at $V_{SS}$, P3 will turn on as Vout goes high driving the source and substrate of P6 high. The gate of P6 is connected to $V_{SS}$ and therefore it also turns on thereby causing the voltage at node A to increase as Vout increases. With the gate of P1 tracking the output voltage, P1 stays off when output node 24 goes high. As output node 24 goes high, the drain/substrate pn junction of P1 is forward biased, driving node E high but the substrate/source pn junction remains reverse biased thereby preventing P1 from being a discharge path to $V_{SS}$.

As the node A voltage increases there must be no current paths to $V_{SS}$. The gate of N4 could be at Vfd resulting in a weakly on device, however, the gate of N5 is at $V_{SS}$ keeping it off, thereby preventing this path from being a discharge path to $V_{SS}$ for node A. The gate of P5 is at $V_{SS}$ or Vfd and if node A is high its drain/substrate pn junction will forward bias creating a conducting path between its drain and source. Since P5 is on, node D voltage increases with the node A voltage resulting in an increase of the drain and substrate of P4. However, the gate of P4 tracks the output node voltage which means it also tracks the node A voltage thereby keeping P4 off. Its substrate/source pn junction remains reverse biased thereby preventing this path from being a discharge path to $V_{SS}$ for node A.

The gate of P7 is connected to node C which also tracks the output node. As node E goes high, P7 remains off and its substrate/source pn junction remains reverse biased thereby preventing this path from being a discharge path to $V_{SS}$. The gate of P8 is at $V_{SS}$ and its source and substrate are at $V_{DD}$-Vfd, therefore it turns on as the output node goes high. This then shorts the substrate of P1 to the output node, resulting in the node E voltage being equal to output node 24 voltage if node 24 voltage is equal to or greater than Vfd or Vtp.

P8 may not be necessary for proper cold spare operation. It depends on whether the substrate of P1 can be left floating or not. In some technologies and environment conditions the substrate must be electrically connected to either the source or drain in order to prevent the lateral BJT created by the source/substrate/drain pnp structure from turning on. P8 effectively shorts the base to the emitter, eliminating the possibility of base current since the base/emitter (i.e., substrate/drain) pn junction is not permitted to forward bias.

The present invention provides an output drive to $V_{DD}$ instead of $V_{DD}$ minus a BJT saturated VCE plus forward bias diode voltage drop. A high output voltage level (VOH) at $V_{DD}$ offers the advantage of satisfying CMOS level output voltage requirements (VOH=$V_{DD}$−0.1V at IOH=−20 μA, VOL=$V_{SS}$+0.1V at IOL=20 μA). Also, A VOH=$V_{DD}$ allows complete turn off of the p-channel transistors in the signal receiving circuit. By turning off the p-channel transistors, crowbar current, i.e., current that flows from $V_{DD}$ to $V_{SS}$ through transistors, can be eliminated, thereby reducing power. This is achieved in the present invention, strictly using only p-channel and n-channel transistors. No bipolar junction transistors (BJT) or diode devices are required and therefore it can be implemented in a pure CMOS technology; a BiCMOS type of technology is not required to implement the present invention.

Based on the above description, when the FIG. 3 schematic is in cold storage ($V_{DD}$ connected to $V_{SS}$), there are no current paths between the cold spare part's $V_{DD}/V_{SS}$ pins and the externally driven signal or bus output node for any voltage.

Figure 2:
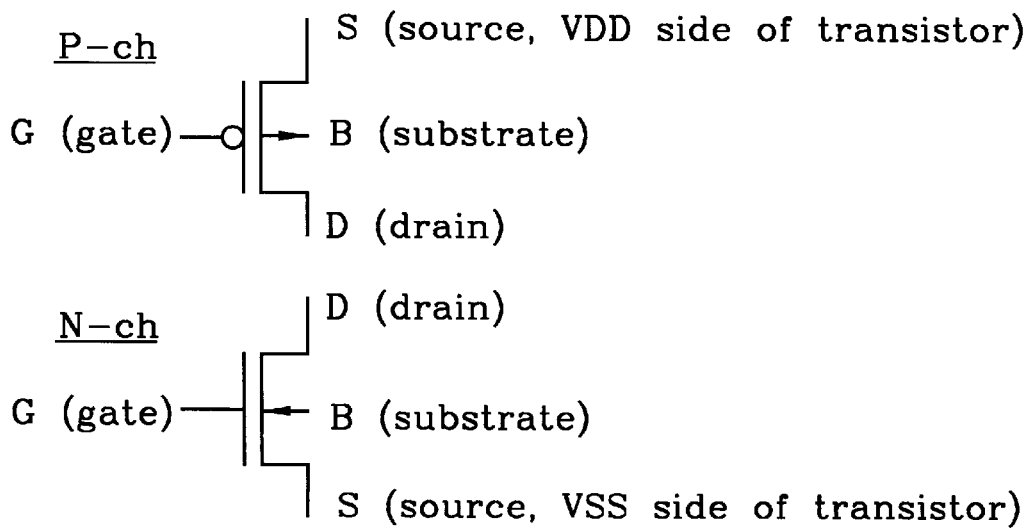
FIG. 2 is a drawing showing p-channel transistor and the n-channel transistor pin definitions.
Figure 5:
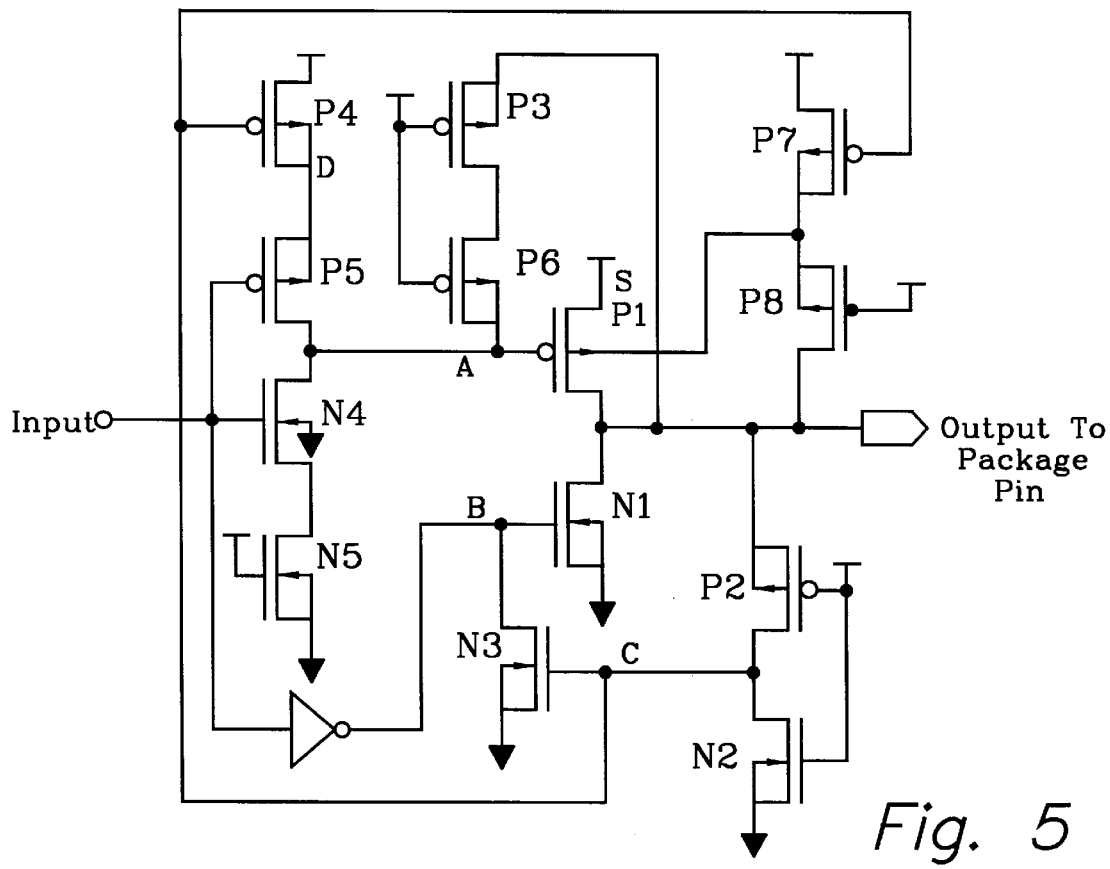
FIG. 5 is a schematic drawing of an alternate embodiment of the present invention.
Figure 6:
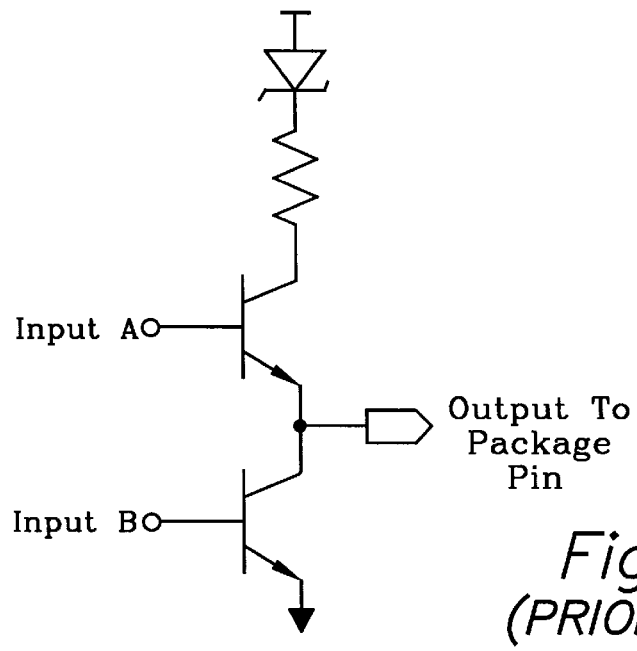
FIG. 6 is a schematic of an output driver according to the prior art.

An alternative embodiment for P3 and P6 in FIG. 2 for driver circuit 10 is shown in FIG. 5. The only difference between FIGS. 3 and 5 is the substrate connection for P3 and P6. In FIG. 5, the substrate of P3 is connected to its source instead of its drain and the substrate of P6 is connected to its drain instead of its source. The operation descriptions for FIG. 3 remain valid for FIG. 5.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

I claim:

1. A CMOS driver circuit, comprising:
    a power supply connection, said power supply connection connected to a positive voltage when said driver circuit is active, said power supply connection connected to ground when said driver circuit is inactive;
    a driver circuit input;
    a first buffer having an input and an output;
    a second buffer having an input and an output, said first buffer input and said second buffer input coupled to said driver circuit input;
    a first p-channel transistor having a gate a source a drain and a substrate, said gate coupled to said first buffer output;
    a first n-channel transistor having a gate, a source, a drain, and a substrate connected to said source, said gate coupled to said second buffer output, with said first p-channel transistor and said first n-channel transistor series connected between said power supply connection and ground;
    a driver circuit output at said series connection, said driver circuit output connected to an external circuit when said driver circuit is active and when said driver circuit is inactive;
    means for maintaining said first n-channel transistor in an off condition when said driver circuit is inactive;
    means for causing said gate of said first p-channel transistor to track a voltage at said external circuit when said driver circuit is inactive, thereby maintaining said first p-channel transistor in an off condition; and
    means for causing the substrate of said first p-channel transistor to substantially equal a voltage at said external circuit when said driver circuit is inactive.

2. A CMOS buffer according to claim 1 wherein said means for causing the substrate of said first p-channel transistor to substantially equal a voltage at said external circuit comprises a coupling transistor that is coupled between the substrate of the first p-channel transistor and the voltage at said external circuit, the coupling transistor being turned on when the driver circuit is inactive.

3. A CMOS buffer according to claim 1 wherein said means for causing said gate of said first p-channel transistor to track the voltage at said external circuit comprises a pair of transistors connected in series between the gate of the first p-channel transistor and the voltage of said external circuit.

4. A CMOS buffer according to claim 1 wherein said means for maintaining said first n-channel transistor in an off condition when said driver circuit is inactive comprises a transistor that is coupled between the gate of the first n-channel transistor and ground, the transistor being turned on when said driver circuit is inactive and the voltage at said external circuit is higher than a predetermined threshold.

5. A CMOS buffer according to claim 1 wherein the first buffer is a logic gate.

6. A CMOS buffer according to claim 5 wherein the logic gate is an inverter.

7. A method for operating a CMOS driver circuit having a power supply connection, said power supply connection connected to a positive voltage when said driver circuit is active, said power supply connection connected to ground when said driver circuit is inactive;
    providing a driver circuit input;
    providing a first buffer having an input and an output;
    providing a second buffer having an input and an output, said first buffer input and said second buffer input coupled to said driver circuit input;
    providing a first p-channel transistor having a gate a source a drain and a substrate, said gate coupled to said first buffer output;
    providing a first n-channel transistor having a gate, a source, a drain, and a substrate connected to said source, said gate coupled to said second buffer output, with said first p-channel transistor and said first n-channel transistor series connected between said power supply connection and ground;
    providing a driver circuit output at said series connection, said driver circuit output connected to an external circuit when said driver circuit is active and when said driver circuit is inactive;
    maintaining said first n-channel transistor in an off condition when said driver is inactive;
    causing said gate of said first p-channel transistor to track a voltage at said external circuit when said driver circuit is inactive, thereby maintaining said first p-channel transistor in an off condition; and
    causing the substrate of said first p-channel transistor to substantially equal a voltage at said external circuit when said driver circuit is inactive.

8. A CMOS driver circuit, comprising:
    a power supply connection, said power supply connection connected to a positive voltage when said driver circuit is active, said power supply connection connected to ground when said driver circuit is inactive;
    a first buffer having an input, an output, and a disable input, said disable input for disabling said first buffer when said driver circuit is inactive;
    a second buffer having an input and an output;
    a first p-channel transistor having a gate, a source, a drain, and a substrate, said gate coupled to said first buffer output;

a first n-channel transistor having a gate, a source, a drain, and a substrate connected to said source, said gate coupled to said second buffer output, with said first p-channel transistor and said first n-channel transistor series connected between said power supply connection and ground;

a driver circuit output at said series connection, said driver circuit output connected to an external circuit when said driver circuit is active and when said driver circuit is inactive;

means for maintaining said first n-channel transistor in an off condition when said driver circuit is inactive;

means for causing said gate of said first p-channel transistor to track a voltage at said driver circuit output when said driver circuit is inactive, thereby maintaining said first p-channel transistor in an off condition; and means for causing said disable input of said first buffer to substantially equal the voltage at said driver circuit output when said driver circuit is inactive.

9. A CMOS buffer according to claim 8 wherein said first buffer comprises two p-channel transistors connected in series between the power supply connection and the output of said first buffer, a gate of one of the two p-channel transistors is connected to the input of said first buffer, and a gate of the other p-channel transistor is coupled to the disable input of said first buffer when the driver circuit is inactive.

10. A CMOS buffer according to claim 9 wherein said means for causing said disable input of said first buffer to substantially equal the voltage at said driver circuit output comprises a p-channel transistor coupled between the disable input of said first buffer and the driver circuit output, the p-channel transistor having a gate that is coupled to said power supply connection.

11. A CMOS buffer according to claim 10 further comprising means for causing the substrate of said first p-channel transistor to substantially equal the voltage of said driver circuit output when said driver circuit is inactive.

12. A CMOS buffer according to claim 11 wherein said means for causing the substrate of said first p-channel transistor to substantially equal the voltage at said driver circuit output comprises a coupling transistor that is coupled between the substrate of the first p-channel transistor and said driver circuit output, said coupling transistor being turned on when the driver circuit is inactive.

13. A CMOS buffer according to claim 12 wherein said means for causing said gate of said first p-channel transistor to track the voltage of said driver circuit output comprises a pair of transistors connected in series between the gate of the first p-channel transistor and the driver circuit output.

14. A CMOS buffer according to claim 13 wherein said means for maintaining said first n-channel transistor in an off condition when said driver circuit is inactive comprises a transistor that is coupled between the gate of the first n-channel transistor and ground, the transistor being turned on when said driver circuit is inactive and the voltage at said external circuit is higher than a predetermined threshold.

15. A CMOS driver circuit, comprising:

a power supply connection, said power supply connection connected to a positive voltage when said driver circuit is active, said power supply connection connected to ground when said driver circuit is inactive;

a first buffer having an input and an output;

a second buffer having an input and an output;

a first p-channel transistor having a gate, a source, and a drain, said gate coupled to said first buffer output;

a first n-channel transistor having a gate, a source, a drain, and a substrate connected to said source, said gate coupled to said second buffer output, with said first p-channel transistor and said first n-channel transistor series connected between said power supply connection and ground;

a driver circuit output at said series connection, said driver circuit output connected to an external circuit when said driver circuit is active and when said driver circuit is inactive;

said first p-channel transistor formed in a well, wherein the well is actively driven when the driver circuit is active, regardless of the state of the driver circuit output;

means for maintaining said first n-channel transistor in an off condition when said driver circuit is inactive;

means for causing said gate of said first p-channel transistor to track a voltage at said driver circuit output when said driver circuit is inactive, thereby maintaining said first p-channel transistor in an off condition.

16. A CMOS buffer according to claim 15 further comprising means for causing said well of said first p-channel transistor to track the voltage at said driver circuit output when said driver circuit is inactive.

17. A CMOS buffer according to claim 16 wherein said means for causing said well of said first p-channel transistor to track the voltage at said driver circuit output comprises a transistor coupled between said well of said first p-channel transistor and said driver circuit output.

* * * * *